US010170560B2

United States Patent
Mears

(12) United States Patent
(10) Patent No.: US 10,170,560 B2
(45) Date of Patent: Jan. 1, 2019

(54) SEMICONDUCTOR DEVICES WITH ENHANCED DETERMINISTIC DOPING AND RELATED METHODS

(71) Applicant: ATOMERA INCORPORATED, Los Gatos, CA (US)

(72) Inventor: Robert J. Mears, Wellesley, MA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 15/629,012

(22) Filed: Jun. 21, 2017

(65) Prior Publication Data

US 2017/0294514 A1 Oct. 12, 2017

Related U.S. Application Data

(62) Division of application No. 14/734,412, filed on Jun. 9, 2015, now Pat. No. 9,716,147.

(Continued)

(51) Int. Cl.

*H01L 29/06* (2006.01)
*H01L 29/15* (2006.01)

(Continued)

(52) U.S. Cl.

CPC ...... *H01L 29/152* (2013.01); *H01L 21/02507* (2013.01); *H01L 21/2652* (2013.01);

(Continued)

(58) Field of Classification Search

CPC ............. H01L 29/152; H01L 21/02507; H01L 21/2652; H01L 21/324; H01L 29/167

See application file for complete search history.

(56) References Cited

U.S. PATENT DOCUMENTS 4,004,950 A 1/1977 Baruch et al.
4,485,128 A 11/1984 Dalal et al.

(Continued)

FOREIGN PATENT DOCUMENTS

EP 0 843 361 5/1998
GB 2 347 520 6/2000

(Continued)

OTHER PUBLICATIONS

U.S. Appl. No. 14/550,272, filed Nov. 21, 2014. See Priority U.S. Appl. No. 14/734,412, filed Jun. 9, 2015.

(Continued)

*Primary Examiner* — Victor A Mandala
*Assistant Examiner* — Colleen E Snow
(74) *Attorney, Agent, or Firm* — Allen, Dyer, Doppelt, + Gilchrist, P.A.

(57) ABSTRACT

A method for making a semiconductor device may include forming a plurality of stacked groups of layers on a semiconductor substrate, with each group of layers including a plurality of stacked base semiconductor monolayers defining a base semiconductor portion and at least one non-semiconductor monolayer constrained within a crystal lattice of adjacent base semiconductor portions. The method may further include implanting a dopant in the semiconductor substrate beneath the plurality of stacked groups of layers in at least one localized region, and performing an anneal of the plurality of stacked groups of layers and semiconductor substrate and with the plurality of stacked groups of layers vertically and horizontally constraining the dopant in the at least one localized region.

21 Claims, 10 Drawing Sheets

Related U.S. Application Data

(60) Provisional application No. 62/009,681, filed on Jun. 9, 2014.

(51) Int. Cl.
*H01L 21/02* (2006.01)
*H01L 21/265* (2006.01)
*H01L 21/324* (2006.01)
*H01L 29/167* (2006.01)

(52) U.S. Cl.
CPC ...... *H01L 21/26513* (2013.01); *H01L 21/324* (2013.01); *H01L 29/151* (2013.01); *H01L 29/167* (2013.01)

(56) References Cited

U.S. PATENT DOCUMENTS 4,590,399 A 5/1986 Roxlo et al.
4,594,603 A 6/1986 Holonyak, Jr.
4,595,603 A 6/1986 Holonyak, Jr.
4,882,609 A 11/1989 Schubert et al.
4,908,678 A 3/1990 Yamazaki
4,937,204 A 6/1990 Ishibashi et al.
4,969,031 A 11/1990 Kobayashi et al.
5,055,887 A 10/1991 Yamazaki
5,081,513 A 1/1992 Jackson et al.
5,216,262 A 6/1993 Tsu
5,357,119 A 10/1994 Wang et al.
5,577,061 A 11/1996 Hasenberg et al.
5,594,567 A 1/1997 Akiyama et al.
5,606,177 A 2/1997 Wallace et al.
5,616,515 A 4/1997 Okuno
5,627,386 A 5/1997 Harvey et al.
5,683,934 A 11/1997 Candelaria
5,684,817 A 11/1997 Houdre et al.
5,994,164 A 11/1999 Fonash et al.
6,058,127 A 5/2000 Joannopoulos et al.
6,255,150 B1 7/2001 Wilk et al.
6,274,007 B1 8/2001 Smirnov et al.
6,281,518 B1 8/2001 Sato
6,281,532 B1 8/2001 Doyle et al.
6,326,311 B1 12/2001 Euda et al.
6,344,271 B1 2/2002 Yadav et al.
6,350,993 B1 2/2002 Chu et al.
6,376,337 B1 4/2002 Wang et al.
6,436,784 B1 8/2002 Allam
6,472,685 B2 10/2002 Takagi
6,498,359 B2 12/2002 Schmidt et al.
6,501,092 B1 12/2002 Nikonov et al.
6,521,519 B2 2/2003 Kamath et al.
6,521,549 B1 2/2003 Kamath et al.
6,566,679 B2 5/2003 Nikonov et al.
6,608,327 B1 8/2003 Davis et al.
6,621,097 B2 9/2003 Nikonov et al.
6,638,838 B1 10/2003 Eisenbeiser et al.
6,646,293 B2 11/2003 Emrick et al.
6,673,646 B2 1/2004 Droopad
6,690,699 B2 2/2004 Capasso et al.
6,711,191 B1 3/2004 Kozaki et al.
6,741,624 B2 5/2004 Mears et al.
6,748,002 B2 6/2004 Shveykin
6,816,530 B2 11/2004 Capasso et al.
6,830,964 B1 12/2004 Mears et al.
6,833,294 B1 12/2004 Mears et al.
6,860,964 B2 3/2005 Park
6,878,576 B1 4/2005 Mears et al.
6,891,188 B2 5/2005 Mears et al.
6,897,472 B2 5/2005 Mears et al.
6,927,413 B2 8/2005 Mears et al.
6,952,018 B2 10/2005 Mears et al.
6,958,486 B2 10/2005 Mears et al.
6,993,222 B2 1/2006 Mears et al.
7,018,900 B2 3/2006 Krepps
7,033,437 B2 4/2006 Mears et al.
7,034,329 B2 4/2006 Mears et al.
7,045,377 B2 5/2006 Mears et al.
7,045,813 B2 5/2006 Mears et al.
7,071,119 B2 7/2006 Mears et al.
7,109,052 B2 9/2006 Mears et al.
7,123,792 B1 10/2006 Mears et al.
7,153,763 B2 12/2006 Hytha et al.
7,202,494 B2 4/2007 Blanchard et al.
7,227,174 B2 6/2007 Mears et al.
7,229,902 B2 6/2007 Mears et al.
7,265,002 B2 9/2007 Mears et al.
7,279,699 B2 10/2007 Mears et al.
7,279,701 B2 10/2007 Kreps
7,288,457 B2 10/2007 Kreps
7,303,948 B2 12/2007 Mears et al.
7,432,524 B2 10/2008 Mears et al.
7,435,988 B2 10/2008 Mears et al.
7,436,026 B2 10/2008 Kreps
7,446,002 B2 11/2008 Mears et al.
7,446,334 B2 11/2008 Mears et al.
7,491,587 B2 2/2009 Rao
7,514,328 B2 4/2009 Rao
7,517,702 B2 4/2009 Halilov et al.
7,531,828 B2 5/2009 Mears et al.
7,531,829 B2 5/2009 Blanchard
7,531,850 B2 5/2009 Blanchard
7,535,041 B2 5/2009 Blanchard
7,586,116 B2 9/2009 Kreps et al.
7,586,165 B2 9/2009 Blanchard
7,598,515 B2 10/2009 Mears et al.
7,612,366 B2 11/2009 Mears et al.
7,625,767 B2 12/2009 Huang et al.
7,659,539 B2 2/2010 Kreps et al.
7,700,447 B2 4/2010 Dukovski et al.
7,718,996 B2 5/2010 Dukovski et al.
7,781,827 B2 8/2010 Rao
7,812,339 B2 10/2010 Mears et al.
7,863,066 B2 1/2011 Mears et al.
7,880,161 B2 2/2011 Mears et al.
7,928,425 B2 4/2011 Rao
8,389,974 B2 3/2013 Mears et al.
8,497,171 B1 7/2013 Wu et al.
2002/0094003 A1 7/2002 Bour et al.
2003/0034529 A1 2/2003 Fitzgerald et al.
2003/0057416 A1 3/2003 Currie et al.
2003/0089899 A1 5/2003 Lieber et al.
2003/0162335 A1 8/2003 Yuki et al.
2003/0215990 A1 11/2003 Fitzgerald et al.
2004/0084781 A1 5/2004 Ahn et al.
2004/0227165 A1 11/2004 Wang et al.
2004/0262594 A1 12/2004 Mears et al.
2004/0262597 A1 12/2004 Mears et al.
2004/0266045 A1 12/2004 Mears et al.
2004/0266046 A1 12/2004 Mears et al.
2004/0266116 A1 12/2004 Mears et al.
2005/0029510 A1 2/2005 Mears et al.
2005/0032247 A1 2/2005 Mears et al.
2005/0163692 A1 7/2005 Atanackovic
2005/0208715 A1 9/2005 Seo et al.
2005/0279991 A1 12/2005 Mears et al.
2005/0282330 A1 12/2005 Mears et al.
2006/0011905 A1 1/2006 Mears et al.
2006/0220118 A1 10/2006 Stephenson et al.
2006/0223215 A1 10/2006 Blanchard
2006/0226502 A1 10/2006 Blanchard
2006/0231857 A1 10/2006 Blanchard
2006/0243964 A1 11/2006 Kreps et al.
2006/0263980 A1 11/2006 Kreps et al.
2006/0267130 A1 11/2006 Rao
2006/0273299 A1 12/2006 Stephenson et al.
2006/0289049 A1 12/2006 Rao
2006/0292765 A1 12/2006 Blanchard et al.
2007/0010040 A1 1/2007 Mears et al.
2007/0012910 A1 1/2007 Mears et al.
2007/0015344 A1 1/2007 Mears et al.
2007/0020833 A1 1/2007 Mears et al.
2007/0020860 A1 1/2007 Mears et al.
2007/0063185 A1 3/2007 Rao
2007/0063186 A1 3/2007 Rao

(56) References Cited

U.S. PATENT DOCUMENTS

| | | | |
|---|---|---|---|
| 2007/0158640 | A1 | 7/2007 | Halilov et al. |
| 2007/0166928 | A1 | 7/2007 | Halilov et al. |
| 2007/0187667 | A1 | 8/2007 | Halilov et al. |
| 2008/0012004 | A1 | 1/2008 | Huang et al. |
| 2008/0197340 | A1 | 8/2008 | Mears et al. |
| 2009/0072276 | A1 | 3/2009 | Inaba |
| 2009/0267155 | A1 | 10/2009 | Izumida et al. |
| 2010/0112780 | A1 | 5/2010 | Thompson et al. |
| 2010/0270535 | A1 | 10/2010 | Halilov et al. |
| 2011/0215299 | A1 | 9/2011 | Rao |
| 2012/0261716 | A1 | 10/2012 | Yanagihara |
| 2013/0026486 | A1 | 1/2013 | Miyoshi et al. |
| 2013/0240836 | A1 | 9/2013 | Lee et al. |
| 2015/0144877 | A1 | 5/2015 | Mears et al. |

FOREIGN PATENT DOCUMENTS

| | | |
|---|---|---|
| JP | 61027681 | 2/1986 |
| JP | 61145820 | 7/1986 |
| JP | 61220339 | 9/1986 |
| JP | 62219665 | 9/1987 |
| WO | 96/29728 | 9/1996 |
| WO | 99/63580 | 12/1999 |
| WO | 02/103767 | 12/2002 |
| WO | 2005034325 | 4/2005 |
| WO | 2007011790 | 1/2007 |
| WO | 2008130899 | 10/2008 |

OTHER PUBLICATIONS

Lou et al., "Chemical Design of Direct-Gap Light-Emitting Silicon", published in Physical Review Letters, vol. 89, No. 7 (Aug. 12, 2002) 4 pgs. See Priority U.S. Appl. No. 14/734,412, filed Jun. 9, 2015.

Raphael Tsu "Si Based Green ELD: Si-Oxygen Superlattice" wysiwyg://1/http://www3.interscience.wiley.com/cgi-bin/abstract/72512946/start: published online Jul. 21, 2000; 2 pgs. Abstract Only. See Priority U.S. Appl. No. 14/734,412, filed Jun. 9, 2015.

Yu et al., GaAs MOSFET with Oxide Gate Dielectric Grown by Atomic Layer Deposition, Agere Systems, Mar. 2003; 7 pgs. See Priority U.S. Appl. No. 14/734,412, filed Jun. 9, 2015.

Novikov et al., Silicon-based Optoelectronics, 1999-2003, pp. 1-6 See Priority U.S. Appl. No. 14/734,412, filed Jun. 9, 2015.

Fan et al., N- and P-Type SiGe/Si Superlattice Coolers, the Seventeenth Intersociety Conference on Thermomechanical Phenomena in Electronic Systems (ITherm 2000), vol. 1, pp. 304-307, Las Vegas, NV, May 2000; 4 pgs. See Priority U.S. Appl. No. 14/734,412, filed Jun. 9, 2015.

Shah et al., Experimental Analysis and Theoretical Model for Anomalously High Ideality Factors (n>2.0) in AlGaN/GaN P—N Junction Diodes, Journal of Applied Physics, vol. 94, No. 4, Aug. 15, 2003; 4 pgs. See Priority U.S. Appl. No. 14/734,412, filed Jun. 9, 2015.

Ball, Striped Nanowires Shrink Electronics, news@nature.com, Feb. 7, 2002; 2 pgs. See Priority U.S. Appl. No. 14/734,412, filed Jun. 9, 2015.

Fiory et al., Light Emission from Silicon: Some Perspectives and Applications, Journal of Electronic Materials, vol. 32, No. 10, 2003; pp. 1043-1051. See Priority U.S. Appl. No. 14/734,412, filed Jun. 9, 2015.

Lecture 6: Light Emitting and Detecting Devices, MSE 6001, Semiconductor Materials Lectures, Fall 2004; 4 pgs. See Priority U.S. Appl. No. 14/734,412, filed Jun. 9, 2015.

Harvard University Professor and Nanosys Co-Founder, Charlie Lieber, Raises the Stakes in the Development of Nanoscale Superlattice Structures and Nanodevices, Feb. 8, 2002, Nanosys, Inc.; 2 pgs. See Priority U.S. Appl. No. 14/734,412, filed Jun. 9, 2015.

Bu, "FINFET Technology, a substrate prospective", IBM Research, PreT0 Alliance, SOI Conference, 2011, pp. 1-28 See Priority U.S. Appl. No. 14/734,412, filed Jun. 9, 2015.

Xu et al, "MOSFET performance and scalability enhancement by insertion of oxygen layers", Department of Electrical Engineering and Computer Science, University of California, Berkeley, 2012, pp. 1-4 See Priority U.S. Appl. No. 14/734,412, filed Jun. 9, 2015.

R. Tsu "Phenomena in silicon nanostructure devices" published online Sep. 6, 2000 by Applied Physics and Materials Science & Processing, pp. 391-402 See Priority U.S. Appl. No. 14/734,412, filed Jun. 9, 2015.

Shinada et al., Nature 437, 1128 (2005)) Retrieved from internet Jun. 19, 2015; 3 pgs See Priority U.S. Appl. No. 14/734,412, filed Jun. 9, 2015.

SEMICONDUCTOR DEVICES WITH ENHANCED DETERMINISTIC DOPING AND RELATED METHODS

TECHNICAL FIELD

The present disclosure generally relates to semiconductor devices and, more particularly, to enhanced dopant implantation techniques for semiconductor devices.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite the advantages provided by such structures, further developments may be desirable for integrating advanced semiconductor materials in various semiconductor devices, such as, for example, with respect to doping of advanced semiconductor structures. Dopant implantation has long been an important technology for semiconductor devices. One approach to doping called deterministic doping (see, e.g., Shinada et al., Nature 437, 1128 (2005)) has been proposed and demonstrated for quantum transport at low temperatures. However, one potential problem for deterministic doping is the subsequent diffusion of dopants, making room temperature stability very challenging.

SUMMARY

A method for making a semiconductor device may include forming a plurality of stacked groups of layers on a semiconductor substrate, with each group of layers including a plurality of stacked base semiconductor monolayers defining a base semiconductor portion and at least one non-semiconductor monolayer constrained within a crystal lattice of adjacent base semiconductor portions. The method may further include implanting a dopant in the semiconductor substrate beneath the plurality of stacked groups of layers in at least one localized region, and performing an anneal of the plurality of stacked groups of layers and semiconductor substrate and with the plurality of stacked groups of layers vertically and horizontally constraining the dopant in the at least one localized region.

More particularly, selectively implanting may include using a focused ion beam, and a depth of the focused ion beam may be selected to a depth of the plurality of stacked groups of layers. Furthermore, annealing may comprise rapid thermal annealing. The at least one localized region may comprise a plurality thereof.

By way of example, the dopant may have a fall-off in a range of 3.0 to 3.3 nm/decade. In addition, forming the plurality of stacked groups of layers may include forming laterally-spaced apart stacked groups of layers on the semiconductor substrate, and implanting may include implanting the dopant in respective localized regions beneath each of the laterally-spaced apart stacked groups of layers.

The dopant may comprise at least one of boron and arsenic, for example. Also by way of example, each base semiconductor portion may comprise silicon, germanium, etc. Furthermore, the at least one non-semiconductor monolayer may comprise a non-semiconductor selected from the group consisting of oxygen, nitrogen, fluorine, and carbon-oxygen. Additionally, at least some semiconductor atoms from opposing base semiconductor portions may be chemically bound together through the at least one non-semiconductor monolayer therebetween.

A related semiconductor device may include a semiconductor substrate, and a plurality of stacked groups of layers on the semiconductor substrate, with each group of layers including a plurality of stacked base semiconductor monolayers defining a base semiconductor portion and at least one non-semiconductor monolayer constrained within a crystal lattice of adjacent base semiconductor portions. The semiconductor device may further include a dopant in the semiconductor substrate beneath the plurality of stacked groups of layers in at least one localized region with the plurality of stacked groups of layers vertically and horizontally constraining the dopant in the at least one localized region.

DETAILED DESCRIPTION

Figure 1:
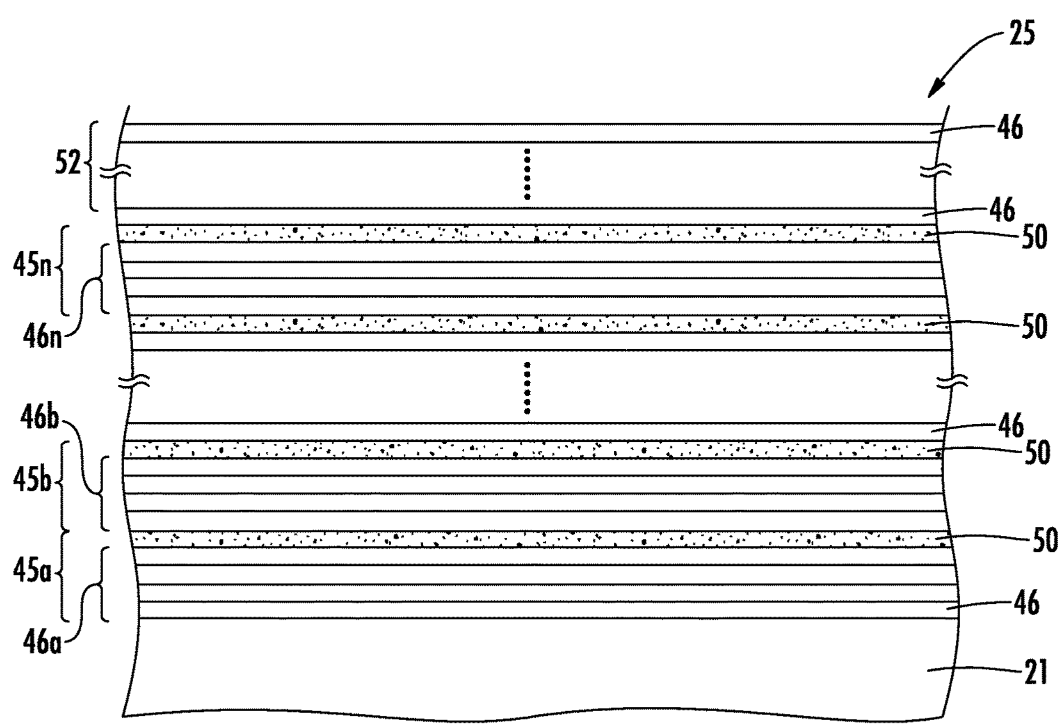
FIG. 1 is a greatly enlarged schematic cross-sectional view of a superlattice for use in a semiconductor device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in different embodiments.

Generally speaking, the present disclosure relates to enhanced deterministic doping techniques for semiconductor devices, particularly those incorporating advanced semiconductor materials such as the superlattice 25 described further below. Applicant has established by atomistic simulation and experimental verification (SIMS) that electrical dopants such as boron and arsenic have an energetic minimum close to (e.g., typically one silicon bond removed from) an oxygen (or CO or N, etc.) atomic layer(s) in the superlattice 25, and preferentially accumulate in this position under thermal diffusion. Following the description of example superlattice structures below, techniques for enhanced deterministic doping of the superlattice 25 are also provided. However, it should be noted that the techniques set forth herein may also be used for other semiconductor layers and structures as well in addition to the noted superlattices, as will be appreciated by those skilled in the art.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k, n))_i (\nabla_k E(k, n))_j \frac{\partial f(E(k, n), E_F, T)}{\partial E} d^3k}{\sum_{E>E_F} \int_{B.Z.} f(E(k, n), E_F, T) d^3k}$$

for electrons and:

$$M_{h,ij}^{-1}(E_F, T) = \frac{-\sum_{E<E_F} \int_{B.Z.} (\nabla_k E(k, n))_i (\nabla_k E(k, n))_j \frac{\partial f(E(k, n), E_F, T)}{\partial E} d^3k}{\sum_{E<E_F} \int_{B.Z.} (1 - f(E(k, n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for use in semiconductor devices. More specifically, the Applicants have identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
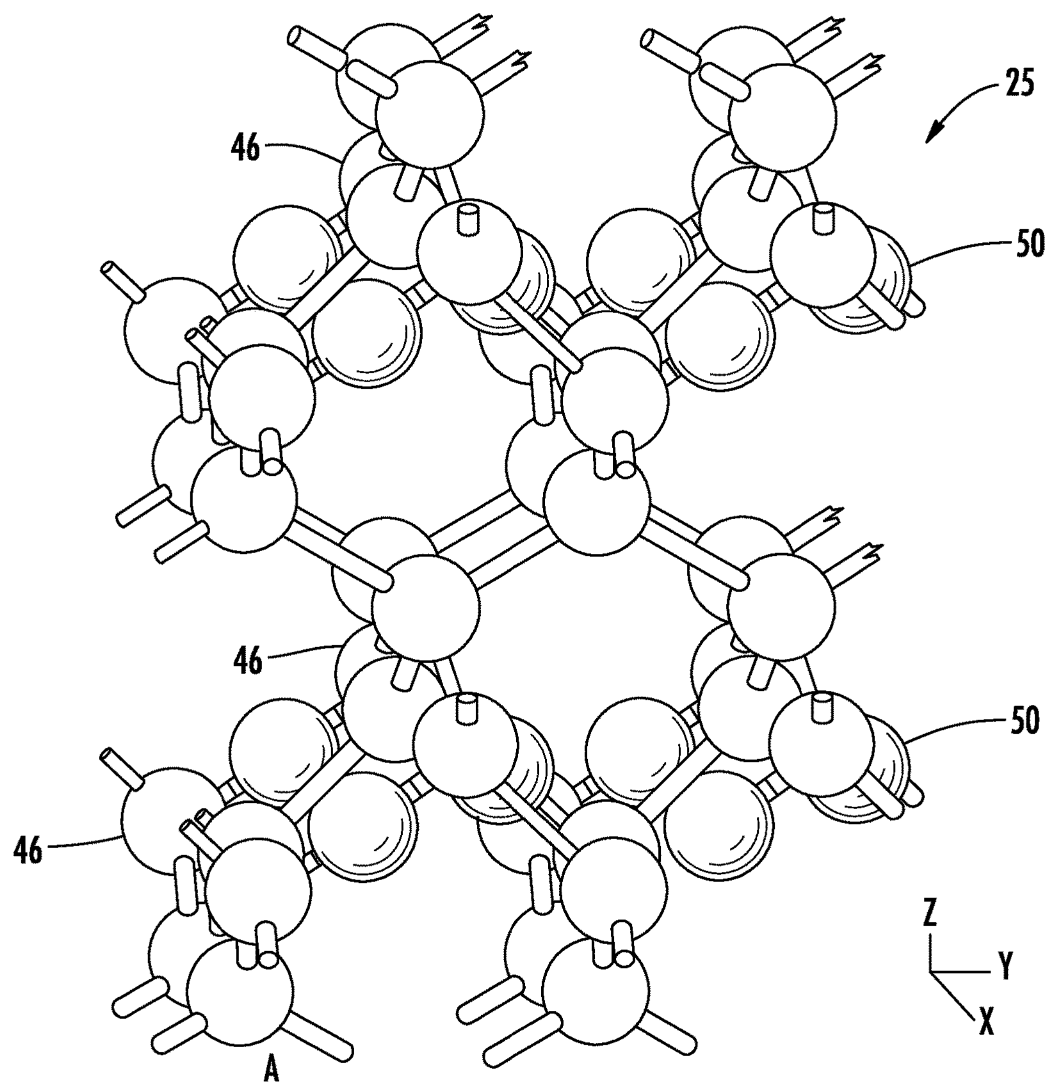
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45*a*-45*n* arranged in stacked relation, as perhaps best understood with specific reference to the schematic cross-sectional view of FIG. 1.

Each group of layers 45*a*-45*n* of the superlattice 25 illustratively includes a plurality of stacked base semiconductor monolayers 46 defining a respective base semiconductor portion 46*a*-46*n* and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46*a*-46*n* are chemically bound together through the non-semiconductor monolayer 50 therebetween, as seen in FIG. 2. Generally speaking, this configuration is made possible by controlling the amount of non-semiconductor material that is deposited on semiconductor portions 46*a*-46*n* through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46*a*-46*n* cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45*n*. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46*a*-46*n* may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
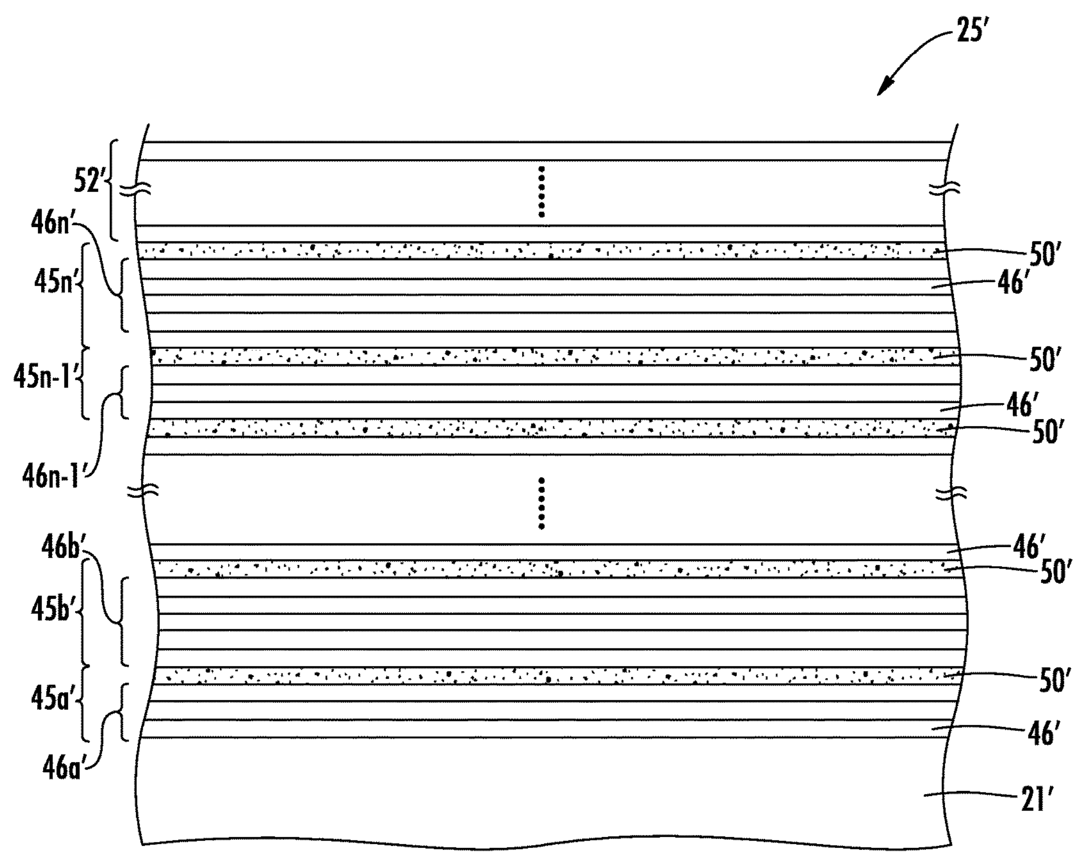
FIG. 3 is a greatly enlarged schematic cross-sectional view of another embodiment of a superlattice in accordance with the invention.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion **46*a'* has three monolayers, and the second lowest base semiconductor portion 46*b'* has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1** and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
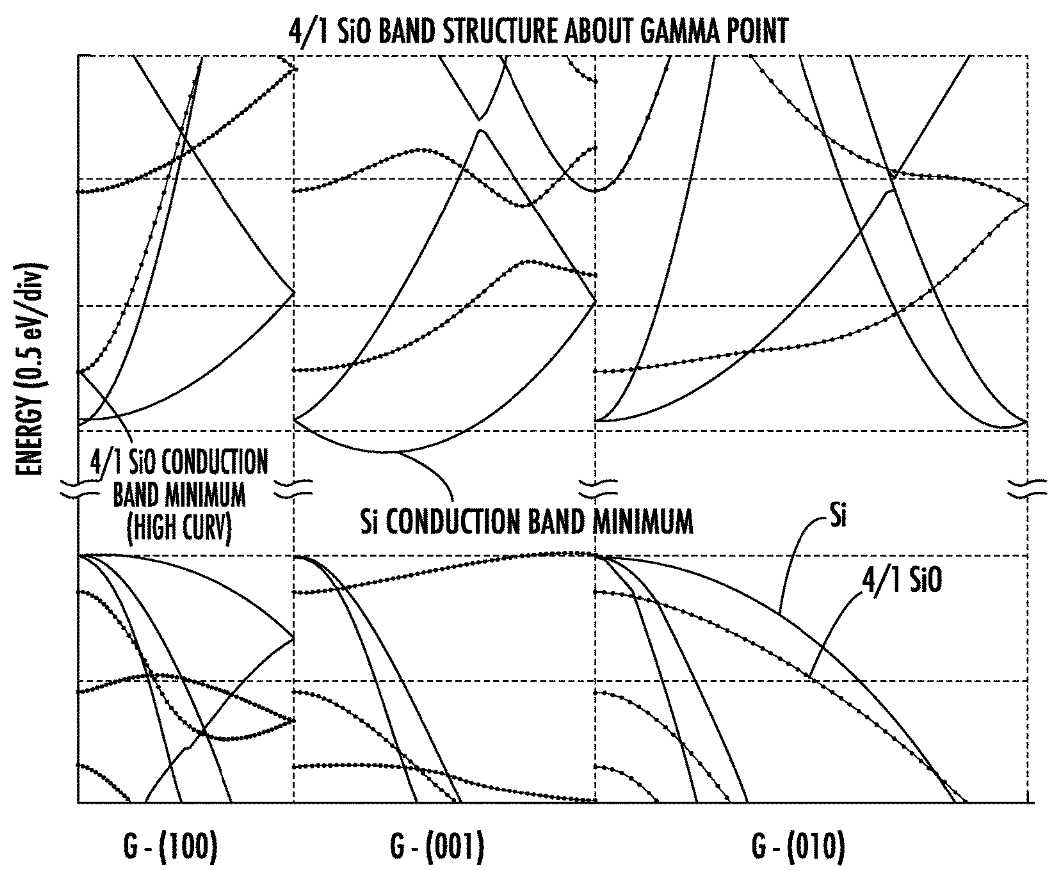
FIG. 4A is a graph of the calculated band structure from the gamma point (G) for both bulk silicon as in the prior art, and for the 4/1 Si/O superlattice as shown in FIGS. 1-2.
Figure 4B:
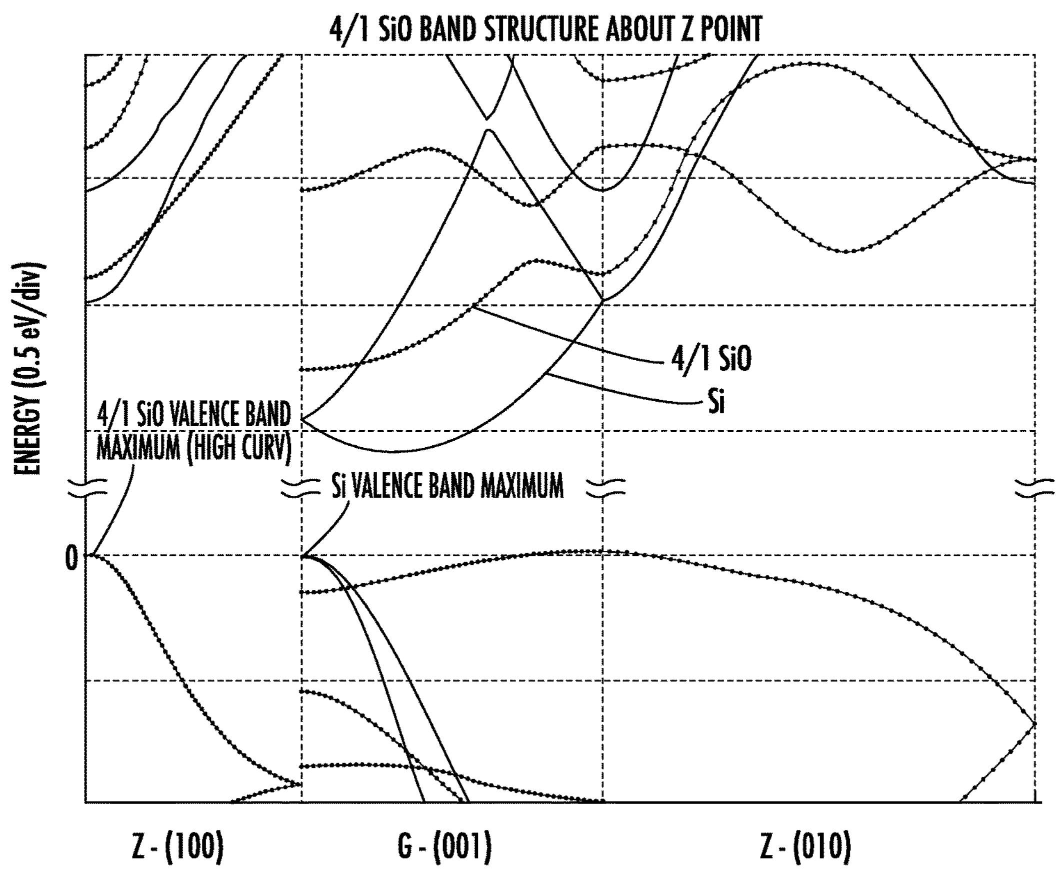
FIG. 4B is a graph of the calculated band structure from the Z point for both bulk silicon as in the prior art, and for the 4/1 Si/O superlattice as shown in FIGS. 1-2.
Figure 4C:
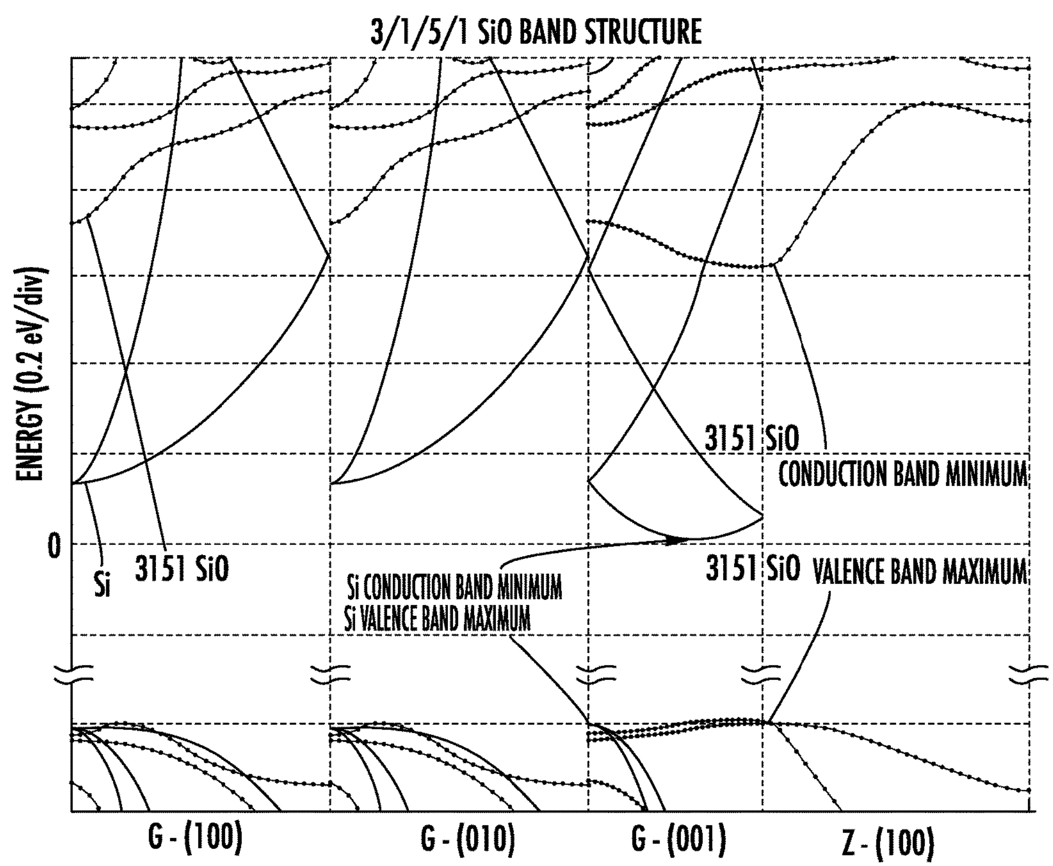
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG, 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
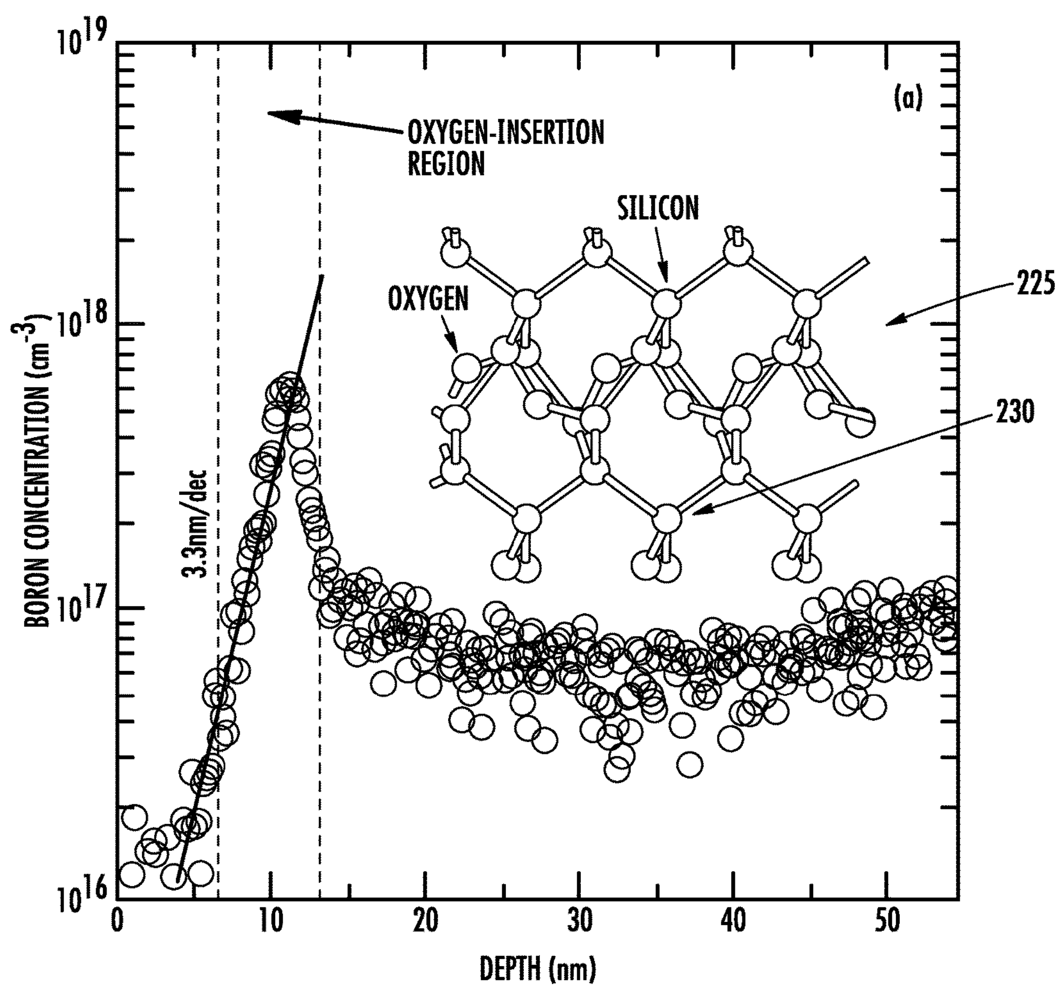
FIG. 5 is a depth profile graph for boron as a dopant with the superlattice illustrated in FIG. 1.

Turning now to FIG. 5, an example approach for performing deterministic doping in a superlattice structure 225 (such as those described above) is first described. As seen in FIG. 5, electrical dopants 230 (e.g., boron, arsenic, etc.) preferentially are substitutionally one silicon bond removed from the Si—O—Si bond. With this approach, an ultra-steep fall-off of doping over multiple orders of magnitude (e.g., as steep as 3.3 nm/dec from enhanced peak) has been measured after rapid thermal annealing (e.g., 1050° C.), as seen in the depth profile graph. In the illustrated example, the dopant is boron, although other dopants may also be used, as noted above. This dopant "pile-up" is also seen in other interface layers between different semiconductor materials, and accordingly may be used with other materials or layers in addition to the superlattice films and structures described herein, as will be appreciated by those skilled in the art.

Figure 6:
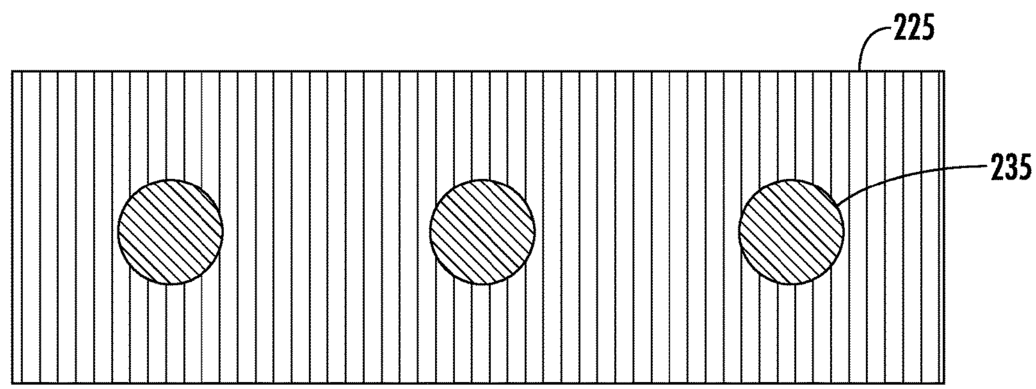
FIG. 6 is a schematic top plan view illustrating a deterministic doping method for making the doped superlattice structure shown in FIG. 5.
Figure 7:
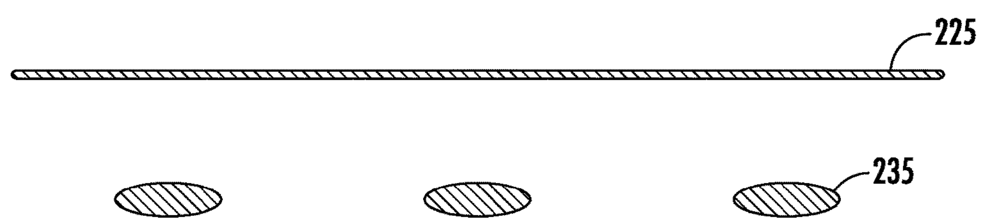
FIG. 7 is a schematic cross-sectional view corresponding to the plan view of FIG. 6.

Referring additionally to FIGS. 6 and 7, deterministic doping is typically performed with a chopped focused ion beam, which in the illustrated example is represented by circles/ovals 235 that represent deterministic electrical doping patterns. Here, the spatially defined electrical dopant layer is "fixed" by the superlattice layer 225. In accordance with a first example embodiment, ion beam energy may be selected close to the depth of superlattice layer 225 so that after implantation the electrical dopant is then "fixed" to that layer spatially, both in a vertical and horizontal sense. Applicant speculates, without wishing to be bound thereto, that this will provide a relatively high localization of the dopant, and impart improved thermal stability under subsequent anneal.

In accordance with an example process flow, the superlattice film 225 may be formed as described above, with a given structure for the preferred depth of dopant, as will be appreciated by those skilled in the art. A chopped focused ion beam may be used to form a (horizontal) spatial pattern of doping with energy to position the dopant close to the superlattice 225 (or other layer in different embodiments). An anneal may then be performed. By choosing the appropriate superlattice film 225 design (e.g., depth of O or other non-semiconductor material atomic layer(s)) and implant energy, a relatively precise location of dopants may be achievable for room temperature operation and above, as will also be appreciated by those skilled in the art. This approach may accordingly be beneficial for reducing variation from random dopant fluctuations in conventional devices, and may facilitate new device architectures, such as for quantum computing devices, for example.

Figure 8:
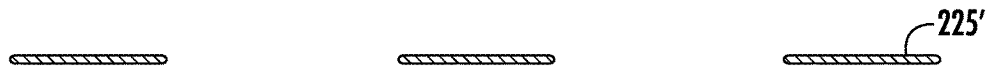
FIGS. 8 and 9 are a series of schematic cross-sectional views illustrating another example approach for making the doped superlattice structure shown in FIG. 5.
Figure 9:
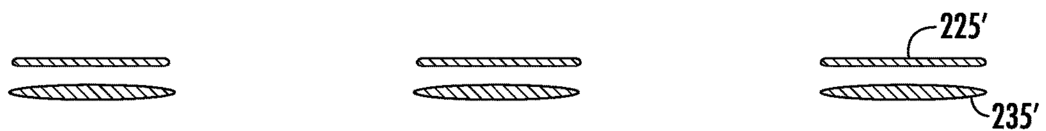
Figure 10:
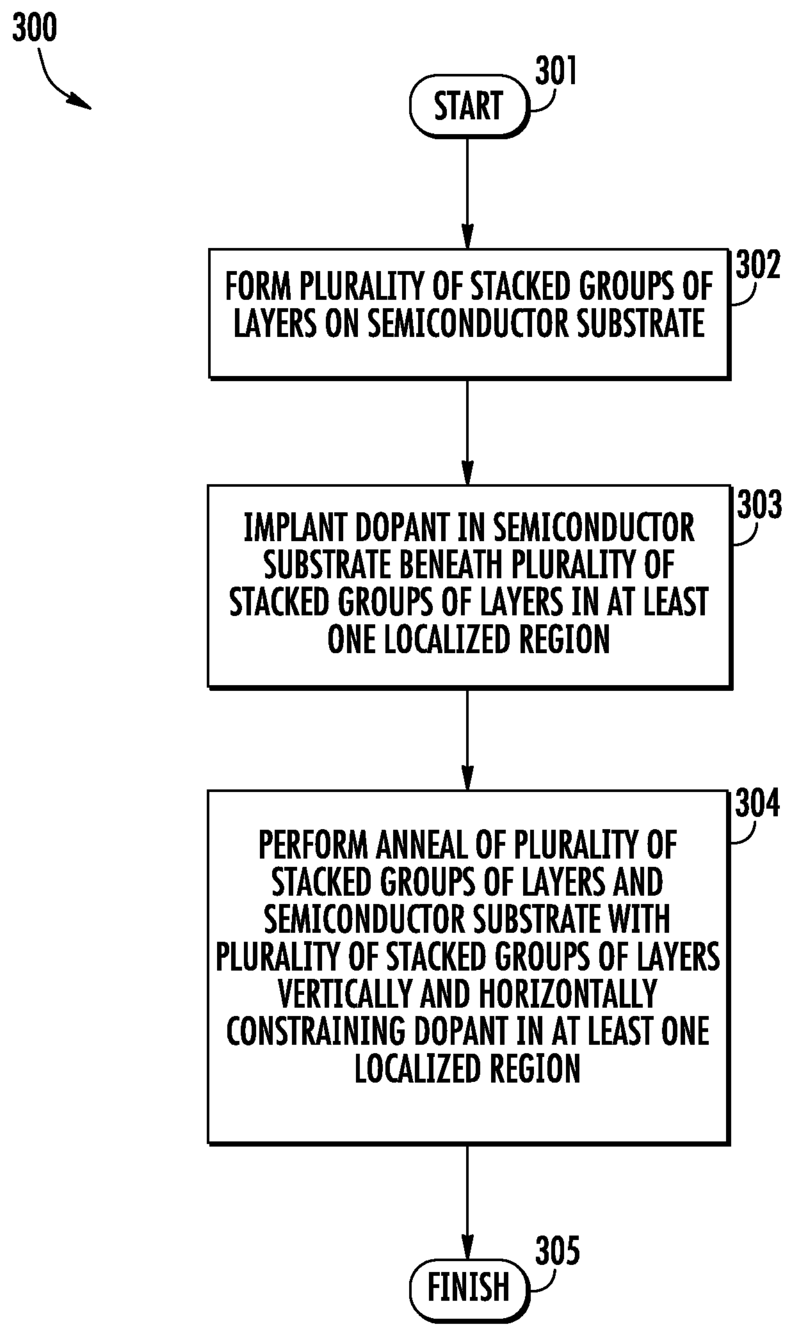
FIG. 10 is a flow diagram illustrating a method for making a semiconductor device in accordance with an example embodiment.

In accordance with another example approach now described with reference to FIGS. 8 and 9, a spatial pattern (i.e., laterally spaced-apart superlattice regions) may be created directly in the superlattice film 225', such as through the selection and implantation of another material (e.g., of an inverse pattern to the desired electrical doping pattern), followed by an anneal to "destroy" the film integrity in the superlattice layer in the implanted regions (FIG. 10). Applicant speculates, without wishing to be bound thereto, that this spatial pattern, in conjunction with either a regular implant pattern 235' of the electrical dopant (or a spatial pattern as described above) may be sufficient to result in desired spatially localized and thermally robust electrical doped regions.

A method for making a semiconductor device using the above-described techniques is now described with reference to the flow diagram 300 of FIG. 10. Beginning at Block 301, the method may include forming a plurality of stacked groups of layers 45*a*-45*n* on a semiconductor substrate 21, at Block 302, with each group of layers including a plurality of stacked base semiconductor monolayers 46 defining a base semiconductor portion 46*a*-46*n* and at least one non-semiconductor monolayer 50 constrained within a crystal lattice of adjacent base semiconductor portions, as discussed further above. The method may further include implanting a dopant 235, 235' in the semiconductor substrate 21 beneath the plurality of stacked groups of layers 45*a*-45*n* in at least one localized region, at Block 303, and performing an anneal of the plurality of stacked groups of layers and semiconductor substrate and with the plurality of stacked groups of layers vertically and horizontally constraining the dopant in the at least one localized region, at Block 304, as discussed further above, which concludes the illustrated method (Block 305).

Many modifications and other embodiments of the invention will come to the mind of one skilled in the art having the benefit of the teachings presented herein. Therefore, it is understood that the invention is not to be limited to the specific exemplary embodiments disclosed herein.

That which is claimed is:

1. A semiconductor device comprising:
a semiconductor substrate;
a plurality of stacked groups of layers on the semiconductor substrate, each group of layers comprising a plurality of stacked base semiconductor monolayers defining a base semiconductor portion and at least one non-semiconductor monolayer constrained within a crystal lattice of adjacent base semiconductor portions; and
a dopant in the semiconductor substrate beneath the plurality of stacked groups of layers in at least one localized region with the plurality of stacked groups of layers vertically and horizontally constraining the dopant in the at least one localized region, the dopant having a fall-off steeper than 3.3 nm/decade.

2. The semiconductor device of claim 1 wherein the at least one localized region comprises a plurality thereof.

3. The semiconductor device of claim 1 wherein the dopant has a fall-off steeper than 3.0 nm/decade.

4. The semiconductor device of claim 1 wherein the plurality of stacked groups of layers comprises laterally-spaced apart stacked groups of layers on the semiconductor substrate; and wherein the dopant is localized in respective localized regions beneath each of the laterally-spaced apart stacked groups of layers.

5. The semiconductor device of claim 1 wherein the dopant comprises at least one of boron and arsenic.

6. The semiconductor device of claim 1 wherein each base semiconductor portion comprises silicon.

7. The semiconductor device of claim 1 wherein each base semiconductor portion comprises germanium.

8. The semiconductor device of claim 1 wherein the at least one non-semiconductor layer comprises oxygen.

9. The semiconductor device of claim 1 wherein the at least one non-semiconductor monolayer comprises a non-semiconductor selected from the group consisting of oxygen, nitrogen, fluorine, and carbon-oxygen.

10. The semiconductor device of claim 1 wherein at least some semiconductor atoms from opposing base semiconductor portions are chemically bound together through the at least one non-semiconductor monolayer therebetween.

11. A semiconductor device comprising:
a semiconductor substrate;
a plurality of stacked groups of layers on the semiconductor substrate, each group of layers comprising a plurality of stacked base semiconductor monolayers defining a base semiconductor portion and at least one non-semiconductor monolayer constrained within a crystal lattice of adjacent base semiconductor portions; and
a dopant in the semiconductor substrate beneath the plurality of stacked groups of layers in at least one localized region with the plurality of stacked groups of layers vertically and horizontally constraining the dopant in the at least one localized region, the dopant having a fall-off steeper than 3.3 nm/decade;
each base semiconductor portion comprising silicon, and the at least one non-semiconductor layer comprising oxygen.

12. The semiconductor device of claim 11 wherein the at least one localized region comprises a plurality thereof.

13. The semiconductor device of claim 11 wherein the dopant has a fall-off steeper than 3.0 nm/decade.

14. The semiconductor device of claim 11 wherein the plurality of stacked groups of layers comprises laterally-spaced apart stacked groups of layers on the semiconductor substrate; and wherein the dopant is localized in respective localized regions beneath each of the laterally-spaced apart stacked groups of layers.

15. The semiconductor device of claim 11 wherein the dopant comprises at least one of boron and arsenic.

16. The semiconductor device of claim 11 wherein at least some semiconductor atoms from opposing base semiconductor portions are chemically bound together through the at least one non-semiconductor monolayer therebetween.

17. A semiconductor device comprising:

a semiconductor substrate;

a plurality of stacked groups of layers on the semiconductor substrate, each group of layers comprising a plurality of stacked base semiconductor monolayers defining a base semiconductor portion and at least one non-semiconductor monolayer constrained within a crystal lattice of adjacent base semiconductor portions; and a dopant in the semiconductor substrate beneath the plurality of stacked groups of layers in at least one localized region with the plurality of stacked groups of layers vertically and horizontally constraining the dopant in the at least one localized region, the dopant having a fall-off steeper than 3.0 nm/decade;

the plurality of stacked groups of layers comprising laterally-spaced apart stacked groups of layers on the semiconductor substrate, and the dopant being localized in respective localized regions being coextensively aligned beneath each of the laterally-spaced apart stacked groups of layers.

18. The semiconductor device of claim 17 wherein the dopant comprises at least one of boron and arsenic.

19. The semiconductor device of claim 17 wherein each base semiconductor portion comprises silicon.

20. The semiconductor device of claim 17 wherein the at least one non-semiconductor layer comprises oxygen.

21. The semiconductor device of claim 17 wherein at least some semiconductor atoms from opposing base semiconductor portions are chemically bound together through the at least one non-semiconductor monolayer therebetween.

* * * * *